(12) United States Patent
Miyoshi et al.

(10) Patent No.: US 7,661,965 B2
(45) Date of Patent: Feb. 16, 2010

(54) SURFACE MOUNTING LUG TERMINAL AND METHOD FOR MOUNTING THE SAME

(75) Inventors: Osamu Miyoshi, Tokyo (JP); Tatsuo Saito, Kariya (JP); Ken Aoki, Kariya (JP)

(73) Assignees: SMK Corporation, Tokyo (JP); Denso Corporation, Kariya (JP)

(*) Notice: Subject to any disclaimer, the term of this patent is extended or adjusted under 35 U.S.C. 154(b) by 0 days.

(21) Appl. No.: 11/822,418

(22) Filed: Jul. 5, 2007

(65) Prior Publication Data

US 2008/0014769 A1    Jan. 17, 2008

(51) Int. Cl.
*H01R 4/66* (2006.01)
*H01R 13/648* (2006.01)

(52) U.S. Cl. ......................................... 439/92; 439/97
(58) Field of Classification Search .................. 439/92, 439/95, 97, 876; 361/753
See application file for complete search history.

(56) References Cited

U.S. PATENT DOCUMENTS

| | | | | |
|---|---|---|---|---|
| 4,842,529 A * | 6/1989 | Frantz et al. | .................. | 439/95 |
| 5,906,496 A * | 5/1999 | DelPrete et al. | ................ | 439/95 |
| 6,024,586 A * | 2/2000 | Kumagai | ...................... | 439/95 |
| 6,695,629 B1 * | 2/2004 | Mayer | ......................... | 439/92 |
| 6,739,880 B2 * | 5/2004 | Toyota | ........................ | 439/74 |
| 7,044,755 B2 * | 5/2006 | Hatakeyama | ................ | 439/97 |
| 7,094,076 B2 * | 8/2006 | Hatakeyama | ................ | 439/97 |
| 7,357,645 B2 * | 4/2008 | Jeong et al. | .................. | 439/66 |
| 2005/0079748 A1 * | 4/2005 | Kim | ............................ | 439/92 |

FOREIGN PATENT DOCUMENTS

| | | |
|---|---|---|
| JP | 06-082999 | 4/1993 |
| JP | 07-161397 | 6/1995 |
| JP | 2863981 | 12/1998 |
| JP | 11-026040 | 1/1999 |
| JP | 2004-319382 | 11/2004 |
| JP | 2005-339964 | 12/2005 |
| JP | 2007-172922 | 7/2007 |
| JP | 2007-317624 | 12/2007 |

\* cited by examiner

*Primary Examiner*—Hae Moon Hyeon
(74) *Attorney, Agent, or Firm*—Kratz, Quintos & Hanson, LLP

(57) ABSTRACT

A surface mounting lug terminal formed of a metallic plate having terminal leads and positioning projections can readily be positioned on a printed board with high precision by fitting the positioning projections into positioning cutouts formed in the printed board. The terminal leads of the surface mounting lug terminal can easily be soldered to land patterns on the printed board to secure the surface mounting lug terminal onto the printed board irrespective of the number of terminal leads. The surface mounting lug terminal can be reduced in size, thus to contribute miniaturization of electronic circuits.

4 Claims, 4 Drawing Sheets

SURFACE MOUNTING LUG TERMINAL AND METHOD FOR MOUNTING THE SAME

BACKGROUND OF THE INVENTION

1. Field of the Invention

This invention relates to a surface mounting lug for use in a variety of electronic devices, and more particularly, to the surface mounting lug used for equalizing a land pattern as a ground pattern of a printed board with a metallic chassis and a method for mounting the same.

2. Description of the Related Art

Conventionally in producing a surface mounting lug terminal, there have been implemented the processes of placing a plurality of terminal leads on the fringe of a rectangular metallic plate in a line-symmetrical arrangement relative to the widthwise center line thereof, applying creamy solder onto a land pattern of a printed board, attaching the terminal leads placed on the lug terminal to the creamy solder, heating the printed board carrying the lug terminal in a reflow furnace to melt the solder, and positioning the lug terminal on the printed board by the action of the surface tension of molten solder, thus to make soldered connection the terminal leads on the land pattern, as disclosed in Japanese Patent No. 2,863,981 (Matsushita Electric Industrial Co., Ltd.).

The conventional surface mounting lug terminal having the structure of being positioned on the printed board by using the surface tension of the molten solder has a disadvantage such that the surface tension is out of balance unless the terminal leads located on the fringe of the metallic plate are arranged line-symmetrically with each other relative to the widthwise center line. Therefore, when the terminal leads are not symmetrical relative to the widthwise center line of the metallic plate, the surface mounting lug terminal is possibly caused to rotate on the printed board to allow the terminal leads secured on the lug terminal to come off the land pattern on the printed board, resulting in defective soldering. Consequently, a screw hole in the printed board is caused to be out of alignment with a screw hole in the lug terminal, so that screws are interrupted by the out-of-place holes when being inserted thereinto, thus to disadvantageously turning up the terminal.

SUMMARY OF THE INVENTION

The present invention has been made to overcome conventional drawback as described above and it is an object of the present invention is to provide a surface mounting lug terminal having terminal leads capable of being accurately soldered in conformity with land patterns on a printed board irrespective of the number of terminal leads even when being mounted on the surface of the board, and a method for mounting the lug terminal on the surface of the board.

Another object of the invention is to provide a surface mounting lug terminal on which positioning projections can readily be formed.

To attain the objects described above according to the invention, there is provided a surface mounting lug terminal comprising terminal leads formed integrally in a metallic plate for reflow soldering, and a plurality of positioning projections protruding from the rear side of the metallic plate.

When the surface mounting lug terminal of the invention is mounted on land patterns of a printed board, it can easily be positioned accurately on the printed board by fitting the positioning projections into positioning cutouts in the printed board Accordingly, the surface mounting lug terminal can easily be mounted adequately and soldered expeditiously onto the land patterns of the printed board irrespective of the number of terminal leads. Furthermore, the surface mounting lug terminal of the invention can be reduced in size, thus to contribute miniaturization of electronic circuits.

The metallic plate has a screw hole with an inner periphery from which the positioning projections protrude downward. To be specific, the positioning projections are formed by bending backward parts protruding from the inner periphery of the screw hole formed in the metallic plate.

The positioning projections may be formed protruding from the periphery of the metallic plate. To be specific, the positioning projections are formed by bending backward parts protruding from the outer sides of the metallic plate.

With the positioning means formed of the positioning projections of the lug terminal and the positioning cutouts in the printed board, the lug terminal can easily be mounted precisely on the printed board in position.

The terminal leads are formed protruding inward from the inner periphery of a relief hole in the metallic plate so as to extend in the relief hole.

Thus, the relief hole is formed in part of the metallic plate other than the land patterns to facilitate mounting of the lug terminal on the printed board.

There are formed solder trapping recesses in parts of the metallic plate at the base portions of the terminal leads.

By the solder trapping recesses in the metallic plate, the molten solder can be prevented from spreading unnecessarily.

The present invention further provides a method for mounting a surface mounting lug terminal, comprising the steps of applying solder cream onto land patterns on a printed board, placing terminal leads formed in a metallic plate of the lug terminal on the solder cream with fitting positioning projections protruding downward from the metallic plate into positioning cutouts formed in the printed board to keep the surface mounting lug terminal in position relative to the printed board, and heating the printed board with the positioned surface mounting lug terminal in a reflow furnace to melt the solder cream, thereby to establish solder connection of the terminal leads to the land patterns of the printed board.

According to the aforementioned method of the invention, the surface mounting lug terminal can easily be positioned accurately on the printed board by fitting the positioning projections into positioning cutouts in the printed board. And, the surface mounting lug terminal can easily be mounted adequately and soldered expeditiously onto the land patterns of the printed board irrespective of the number of terminal leads. Furthermore, the surface mounting lug terminal of the invention can be reduced in size, thus to contribute miniaturization of electronic circuits.

Other and further objects of this invention will become obvious upon an understanding of the illustrative embodiments about to be described or will be indicated in the appended claims, and various advantages not referred to herein will occur to one skilled in the art upon employment of the invention in practice.

DESCRIPTION OF THE DRAWINGS

FIGS. 3(A) through 3(H) are explanatory diagrams illustrating a method of mounting the surface mounting lug terminal of the invention, wherein FIGS. 3(A) and 3(B) are front and side views showing the state of placing the lug terminal on a printed board, FIGS. 3(C) and (D) are front and side views showing the suite of applying solder cream to land patterns on the printed board, FIGS. 3(E) and 3(F) are front and longitudinal sectional views showing the state of soldering the lug terminal to the printed board, and FIGS. 3(G) and 3(H) are front and side views showing the state of securing the lug terminal to the printed board by screwing.

DETAILED DESCRIPTION OF THE PREFERRED EMBODIMENTS OF THE INVENTION

Figure 1:
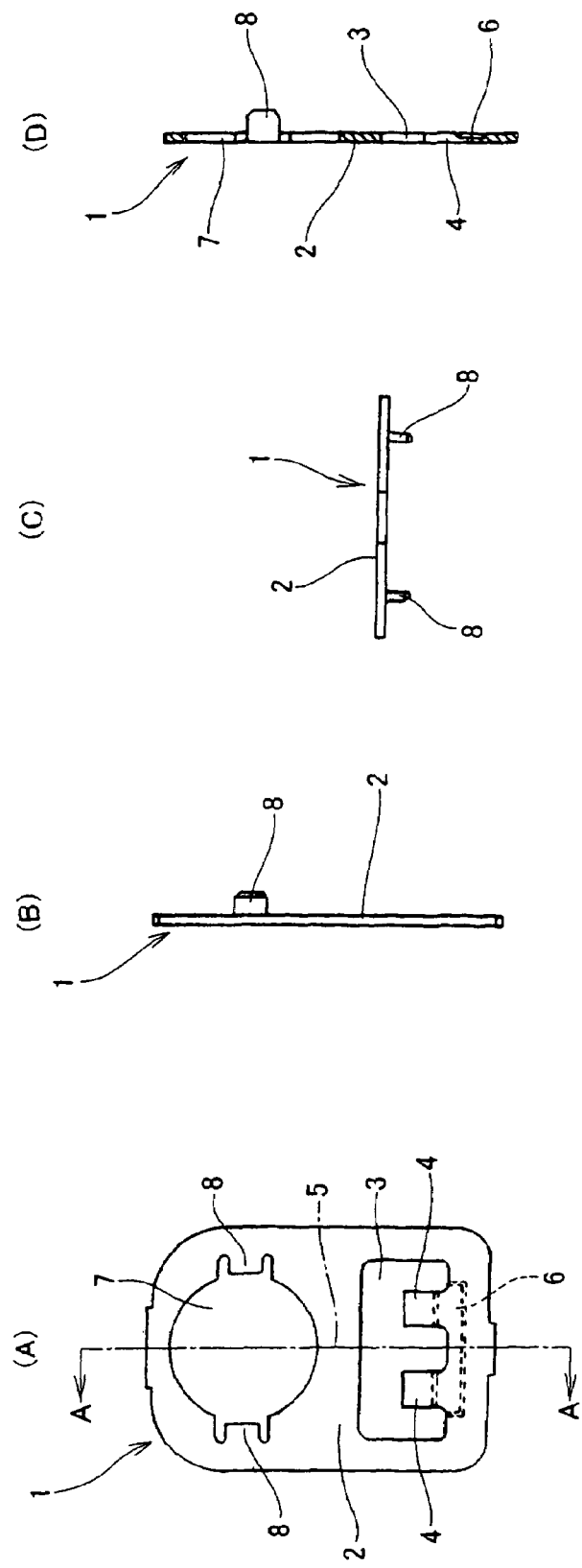
FIGS. 1(A) through 1(D) are front view, side view, bottom view and sectional view, illustrating a first embodiment of a surface mounting lug terminal according to the invention.
Figure 2:
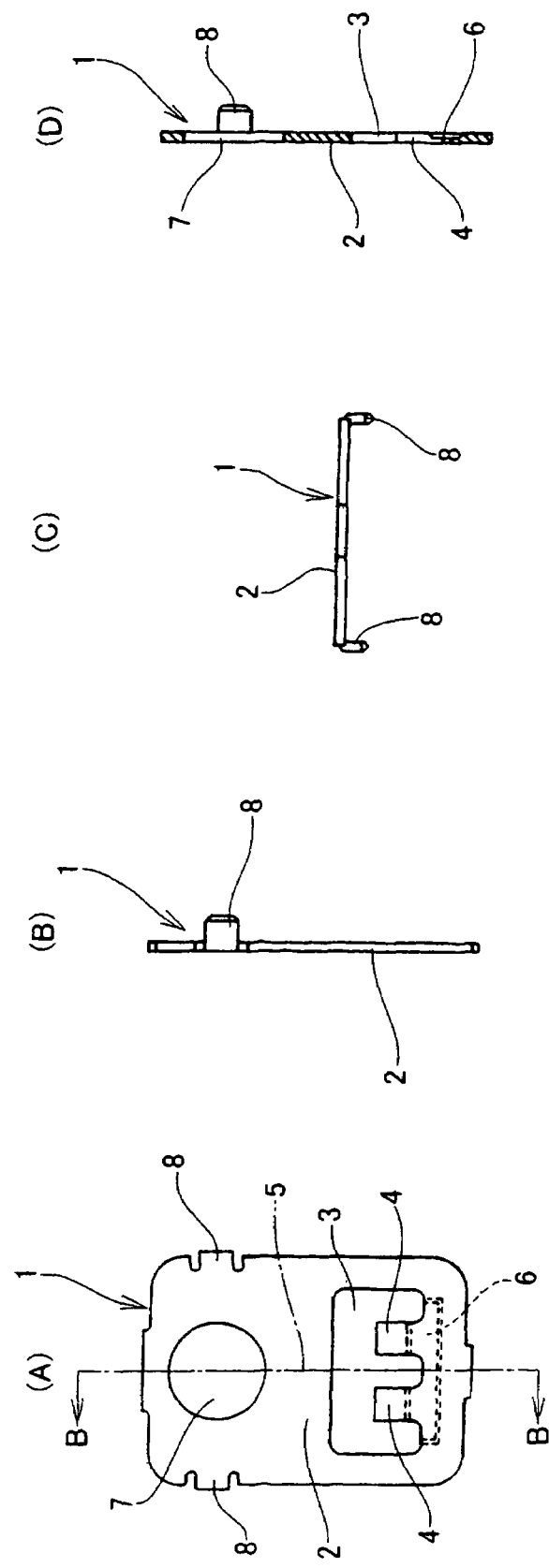
FIGS. 2(A) through 2(D) are front view side view, bottom view and sectional view, illustrating a second embodiment of the surface mounting lug terminal according to the invention.

The surface mounting lug terminal and method for mounting the terminal lug according to the invention will be described hereinafter with reference to the accompanying drawings.

As shown in FIG. 1(A) through 1(D), the surface mounting lug terminal 1 in the first embodiment of the invention is mainly formed of a rectangular metallic plate 2 having a relief hole 3 on the one side surface thereof and terminal leads 4 protruding inward from the inner periphery of the relief hole 3 in the metallic plate. The terminal leads 4 is formed on one side part to the longitudinal direction in line-symmetrical relation to the widthwise center line 5 of the metallic plate 2. Also, the relief hole 3 is formed line-symmetrically relative to the widthwise center line 5 of the metallic plate 2 in part of the metallic plate other than land patterns on a printed board as will hereinafter be described in derail. The metallic plate 2 is provided in its lower surface with solder trapping recesses 6 at the base portions of the terminal leads 4.

In the other side part to the longitudinal direction of the rectangular metallic plate 2, there is formed a circular screw hole 7 line-symmetrical relative to the widthwise center line 5 of the metallic plate 2. The metallic plate 2 further has positioning projections 8 protruding downward from the inner periphery of the screw hole 7. That is, the positioning projections 8 are formed by bending downward parts protruding front the inner periphery of the screw hole formed in the metallic plate. These two positioning projections 8 are line-symmetrical relative to the widthwise center line 5 of the metallic plate 2.

In FIGS. 2(A) through 2(D) showing the second embodiment of the surface mounting lug terminal according to the invention, the elements depicted by like reference numerals with respect to those of the first embodiment have analogous structures and functions to those of the first embodiment and will not be described in detail again.

The surface mounting lug terminal 1 in the second embodiment is formed of a rectangular metallic plate 2 having positioning projections 8 protruding downward from the outer longitudinal sides proximate to the screw hole 7. The positioning projections 8 are line-symmetrical to the widthwise center line 5 of the metallic plate 2 and formed in the same manner as those in the first embodiment described above.

As illustrated in FIGS. 3(A) through 3(H), the method for mounting the terminal lug according to the invention may be implemented in the manner as described below.

All of first, a pair of land patterns 10 are formed on the printed board 9 in conformity with the paired terminal leads 4 formed on the surface mounting lug terminal 1 in the foregoing first embodiment. The entire size of the land patterns 10 is so determined as to be incorporated in the relief hole 3 in the surface mounting lug terminal 1. Further in the printed board 9, a circular screw hole 11 is formed in conformity with the screw hole 7 in the surface mounting lug terminal 1 as described above about the first embodiment of the invention. The screw hole 11 may preferably be made smaller than the screw hole 7 in the surface mounting lug terminal 1. In the inner periphery of the screw hole 11, positioning cutouts 12 are formed so as to fittingly receive the positioning projections 8 of the lug terminal 1 of the first embodiment.

Figure 3:
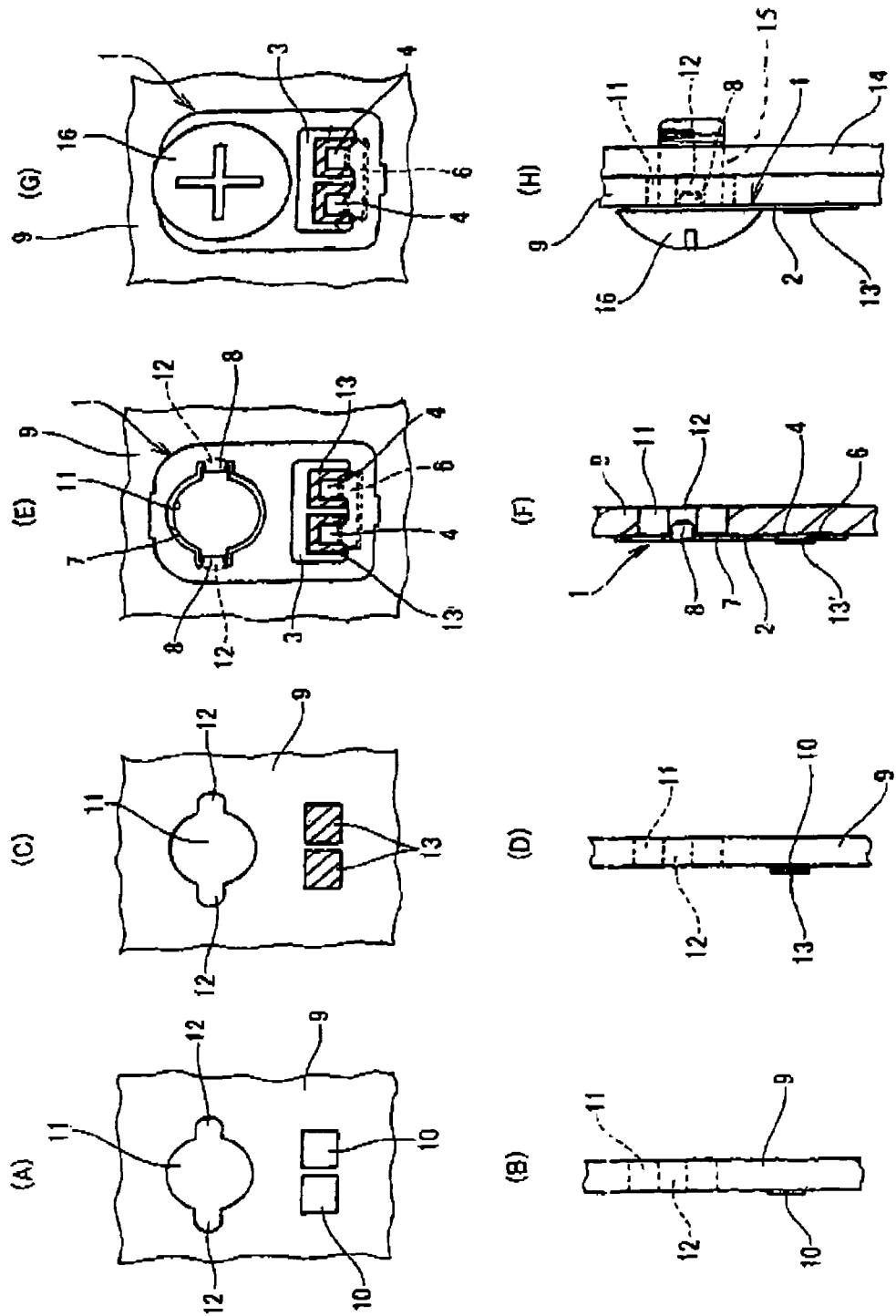

Next soldering cream 13 is applied onto the land patterns 10 on the printed board 9 by printing as illustrated in FIGS. 3(C) and 3(D).

Next the surface mounting lug terminal 1 of the first embodiment is placed on the printed board 9 carrying the solder cream 13 corresponding to the land patterns 10, while fitting the positioning projections 8 of the lug terminal 1 into the positioning cutouts 12 of the printed board 9. Thus, the surface mounting lug terminal 1 is set in position on the printed board 9 to place the terminal leads 4 on the solder cream 13 applied to the land patterns 10 and align the screw hole 7 with the screw hole 11. Then, the printed board 9 carrying the surface mounting lug terminal 1 is heated in a reflow furnace, which is not shown in the drawings, to melt the solder cream 13, consequently to make soldered connection of the terminal leads 4 to the land patterns 10.

Thereafter, the printed board 9 soldered to the surface mounting lug terminal 1 is placed on a chassis 14 made of metal, aligning the screw hole 11 of the printed board 9 with a screw hole 15 of the chassis 14, as illustrated in FIG. 3H. Then, the printed board 9 is fixedly secured to the chassis 14 by inserting a metal screw 16 into the aligned screw holes 7 and 11 and tightening the screw. In this state, the land pattern 10 of the printed board 9 in connection with the chassis 14 through the surface mounting lug terminal 1 and the screw 16 becomes equal in electric potential to the chassis 14.

Thus, the surface mounting lug terminal 1 having the positioning projections 8 on the metallic plate 2 can easily be held in position on the land pattern 10 of the printed board 9 with accuracy by fitting the positioning projections 8 into the positioning cutouts 12 formed in the printed board 9, so as to facilitate suitably soldering of the terminal leads 4 to the land pattern 10 of the printed board 9. That is, the surface mounting lug terminal can easily be mounted adequately and soldered expeditiously onto the land patterns of the printed board irrespective of the number of terminal leads. Consequently, the surface mounting lug terminal of the invention can be reduced in size, thus to contribute miniaturization of the terminal leads and electronic circuits.

Furthermore, the positioning projections 8, which are formed protruding downward from the inner periphery of the screw hole formed in the metallic plate 2 in this embodiment, can easily be formed by bending parts protruding inwardly form the metallic plate 2.

Also the terminal leads 4 can easily be formed by punching the metallic plate 2 to form the relief hole 3.

Besides, the solder trapping recesses 6 formed in the metallic plate 2 at the base portions of the terminal leads 4 can prevent the molten solder from spreading unnecessarily.

The method for mounting a surface mounting lug terminal according to the invention comprises applying solder cream 13 onto the land patterns 10 on the printed board 9, placing the terminal leads 4 formed on the metallic plate of the lug terminal 1 on the solder cream with fitting the positioning projections 8 protruding downward from the metallic plate into the positioning cutouts 12 formed in the printed board 9 to keep the surface mounting lug terminal 1 in position relative to the printed board 9, and beating the printed board 9 with the positioned surface mounting lug terminal 1 in a reflow furnace to melt the solder cream 13, thereby to establish solder connection of the terminal leads 4 to the land patterns 10 of the printed board 9. The method of the invention has advantages such that the surface mounting lug terminal can easily be positioned accurately on the printed board by fitting the positioning projections into positioning cutouts in the printed board and can easily be mounted adequately and soldered expeditiously onto the land patterns of the printed board irrespective of the number of terminal leads, and that the surface mounting lug terminal of the invention can be reduced in size, thus to contribute miniaturization of electronic circuits.

Figure 4:
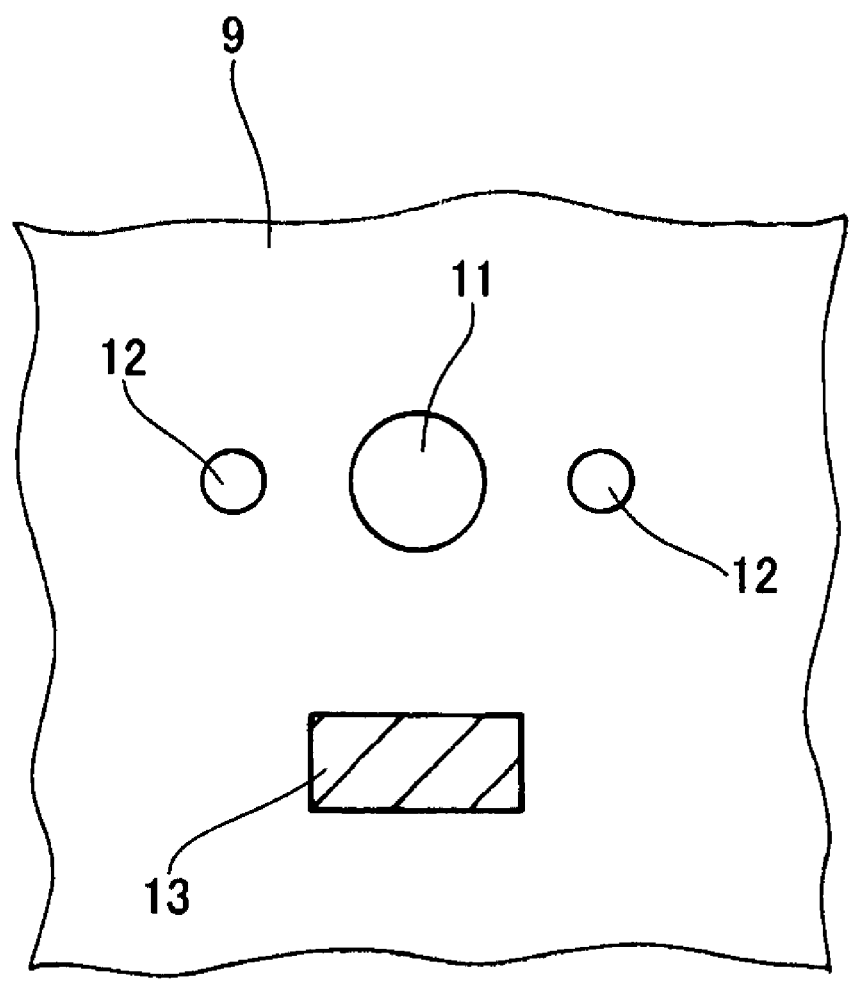
FIG. 4 is a front view showing a principal part of the printed board in a second embodiment of the method for mounting the lug terminal according to the invention.

The second embodiment of the method for mounting a surface mounting lug terminal according to the invention will be described with reference to FIG. 4. The surface mounting lug terminal 1 used in the first embodiment shown in FIGS. 2(A)-2(D) is mounted on the printed board 9 by the method of this embodiment.

The printed board 9 to which the mounting method of this embodiment is applied has the land patterns 10 connected to the terminal leads 4 of the surface mounting lug terminal 1 shown in FIGS. 2(A)-2(D), the screw hole 11 matched with the screw hole 7 in the surface mounting lug terminal 1, and positioning cutouts 12 for receiving the positioning projections 8 of the surface mounting lug terminal 1. Onto the land pattern 10, solder cream 13 is applied by printing.

On the printed board 9 having the aforementioned structure, the surface mounting lug terminal 1 in the second embodiment shown in FIGS. 2(A)-2(D) is set in position, soldered in the reflow furnace, and then, fixed onto the chassis by the method applied to the first embodiment described above.

While the invention has been explained by reference to particular embodiments thereof, and while these embodiments have been described in considerable detail, the invention is not limited to the representative apparatus and methods described. Those of ordinary skill in the art will recognize various modifications which may be made to the embodiments described herein without departing from the scope of the invention. Accordingly, the scope of the invention is to be determined by the following claims.

What is claimed is:

1. A surface mounting lug terminal comprising terminal leads formed integrally in a metallic plate for reflow soldering onto land patterns of a printed board, and a plurality of positioning projections protruding from the rear side of the metallic plate for positioning the surface mounting lug terminal relative to the land patterns prior to reflow soldering, wherein
said rear side faces the printed board, and
said terminal leads are formed protruding inward from the inner periphery of a relief hole in said metallic plate.

2. The surface mounting lug terminal claimed in claim 1, wherein solder trapping recesses are formed in said metallic plate at base portions of said terminal leads whereat the terminal leads are connected to the inner periphery of the relief hole.

3. A surface mounting lug terminal comprising terminal leads formed integrally in a metallic plate for reflow soldering onto land patterns of a printed board, and a plurality of positioning projections protruding from the rear side of the metallic plate for positioning the surface mounting lug terminal relative to the land patterns prior to reflow soldering, wherein
said rear side faces the printed board,
said positioning projections protrude downward from the inner periphery of a screw hole formed in said metallic plate and
said terminal leads are formed protruding inward from the inner periphery of a relief hole in said metallic plate.

4. A surface mounting lug terminal comprising terminal leads formed integrally in a metallic plate for reflow soldering onto land pattern of a printed board, and a plurality of positioning projections protruding from the rear side of the metallic plate for positioning the surface mounting lug terminal relative to the lend patterns prior to reflow soldering, wherein
said rear side faces the printed board,
said positioning projections protrude downward from the outer side of said metallic plate and said terminal leads are formed protruding inward from the inner periphery of a relief hole in said metallic plate.

\* \* \* \* \*